United States Patent [19]

Luscher

[11] 4,405,906
[45] Sep. 20, 1983

[54] LOW POWER CONSUMPTION C-MOS OSCILLATOR

[75] Inventor: Jakob Luscher, Venthone, Switzerland

[73] Assignee: Asulab S.A., Bienne, Switzerland

[21] Appl. No.: 282,030

[22] Filed: Jul. 10, 1981

[30] Foreign Application Priority Data

Jul. 21, 1980 [CH] Switzerland .......................... 5555/80

[51] Int. Cl.³ .............................................. H03B 5/36
[52] U.S. Cl. ............................... 331/116 FE; 368/159
[58] Field of Search ................... 331/116 FE; 368/159

[56] References Cited

U.S. PATENT DOCUMENTS 3,887,881 6/1975 Hoffman ................... 331/116 FE X
4,360,789 11/1982 Lewyn et al. ................... 368/159 X

Primary Examiner—Siegfried H. Grimm
Assistant Examiner—S. Clark

Attorney, Agent, or Firm—Philip M. Hinderstein

[57] ABSTRACT

A C-MOS oscillator circuit having input and output terminals adapted to be connected to a resonator and two active MOS transistors of complementary types connected in series between the supply terminals of the circuit, which supply terminals are connected to the positive and negative poles of a source of d.c. voltage, the sources of the transistors being connected to a supply terminal and the drains being connected to the output terminal. The d.c. bias and the a.c. voltage control of each of the active transistors are ensured by a MOS transistor of the same type connected as a diode between its gate and its drain, a current source connected between its gate and the supply terminal to which the source of the other active transistor is connected, and a capacitive voltage divider which is connected between the supply terminal, to which its source is connected, and the input terminal, and the intermediate point of which is connected to its gate.

10 Claims, 7 Drawing Figures

LOW POWER CONSUMPTION C-MOS OSCILLATOR

BACKGROUND OF THE INVENTION

1. Field of the Invention

The present invention relates to a C-MOS oscillator circuit and, more particularly, to an oscillator circuit intended to be used in quartz wrist watches.

2. Description of the Prior Art

The present trend in this field is to seek to lower the power consumption of integrated electronic circuits as much as possible, so as to achieve independent operation for several years for these watches which can contain only batteries of a small size and very low energy capacity. Equally important, for economic reasons, is the desire to design circuits which are as insensitive as possible to the inevitable variations encountered in manufacturing processes.

An important parameter for any MOS circuit is the value of the threshold voltage of the transistors. Although the differences between the threshold voltages of the transistors of one and the same circuit are normally extremely small (of the order of one-hundredth of a volt), the same is not true of the differences between the threshold voltages of the transistors from one circuit to another. These differences can, in fact, reach several tenths of a volt. So as to incur little waste during manufacture, it is very important that the functioning of the circuits is not prejudiced by such variations.

Most of the electronic watches on the market at present have a quartz crystal of 32,768 Hz as the time base. The frequency divider and the system needed to drive a stepping motor or to control a digital display consists of C-MOS circuits. This technique is highly suitable for all those circuits where the transistors in effect represent "on-off" elements. The same has not been true, however, of the oscillator circuit which is an analog circuit. It would be highly desirable, from an economic point of view, to be able to integrate the oscillator circuit by means of those very same processes required for all the other circuits of the watch.

To produce quartz oscillators having a very low power consumption, resistors have been used, particularly diodes made of polycrystalline silicon, which can have relatively high resistances. Layers of silicon are deposited by means of CVD processes on a layer of silicon dioxide which are subsequently doped "p" and "n", so as to form diodes, the characteristics of which approximate, more or less, those of a resistor. These characteristics are difficult to reproduce and, consequently, the need to resort to resistors represents a considerable disadvantage.

A C-MOS oscillator circuit which finds very widespread use at the present time is that which is the subject of French Pat. No. 2,110,109. The active element of the circuit consists of an inverter supplied by a source of d.c. voltage. A gate-bias resistor of a sufficiently large value (above 10 MΩ) to limit the losses is connected between the output and input of the inverter, in parallel with the quartz resonator. Two capacitors are connected between a terminal on the voltage source and the input and output of the inverter, respectively. One of these capacitors is variable so as to enable the oscillation frequency to be adjusted.

Apart from the fact that it contains a resistor, this oscillator circuit has the following disadvantages: since the transconductance of the transistors increases greatly with the amplitude of their control voltages, the amplitude is limited by overexciting the transistors. The result of this is high power consumption. Furthermore, as is well known, overexciting increases the phase shift between the output and input voltages of the active transistors, thus reducing the frequency stability of the oscillator. Furthermore, to ensure that oscillation starts, it is necessary for the two transistors to be conductive at the same time, which requires, for this circuit, a supply voltage greater than the sum of the threshold voltages of the two transistors. This creates severe demands on the tolerances permitted for the threshold voltages of the transistors when the supply voltage is low, as is the case in an electronic watch.

In most electronic watches presently available, the threshold voltage of the transistors used in digital circuits can be between approximately 0.3 volts and $V_p - \Delta V$, where $V_p$ represents the voltage of the battery and $\Delta V$ the minimum difference between the control voltage and the threshold voltage of the transistors of the frequency-divider circuits. If the threshold voltage were below 0.3 volts, the current resulting from low-inversion operation of the transistors of all circuits could cause an unacceptable consumption of energy. For the oscillator of the French patent, the sum of the threshold voltages of the two types of transistors must, therefore, be between 0.6 volts and $V_p - 2\Delta V$. For example, for a supply voltage of 1.2 volts, and assuming that a difference $\Delta V$ of 0.1 volt is sufficient to ensure that oscillation starts, the sum of the threshold voltages of the P-type and N-type transistors can only be between 0.6 and 1 volt, implying much stricter tolerances for the manufacture of the oscillator than for that of the digital circuits. For the latter, even allowing that $\Delta V$ is 0.2 volts, the threshold voltages of each type of transistor can be between 0.3 and 1 volt.

Figure 1:
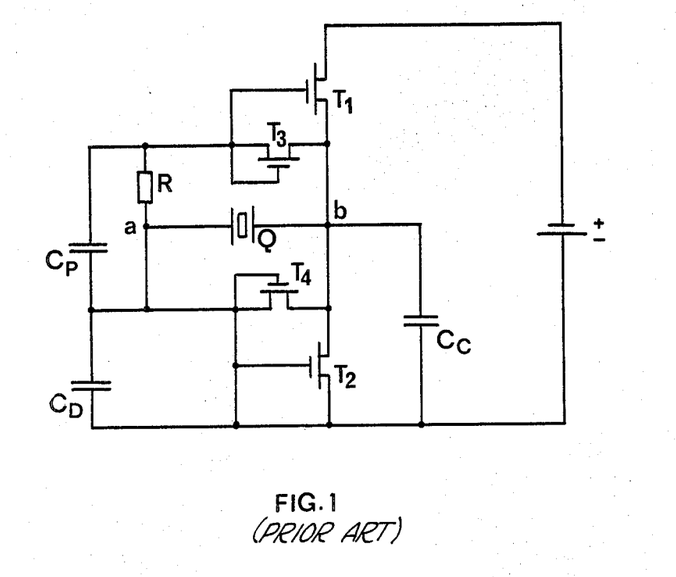
FIGS. 1 and 2 are circuit diagrams of known oscillator circuits.

One solution which makes it possible, to a certain extent, to avoid overexciting the transistors and consequently to reduce the current consumption is the subject of Swiss Pat. No. 596,598. The oscillator circuit described in this patent is illustrated in FIG. 1 of the present drawings. However, this oscillator circuit retains the other two disadvantages of the circuit of the French patent, that is, it contains a resistor R and the demands regarding the tolerances for the threshold voltages of the transistors are just as severe. In fact, during starting, capacitor $C_p$ is discharged and the gates of transistors $T_1$ and $T_2$ are at the same potential. Since these transistors must, under these conditions, conduct simultaneously, the supply voltage must be greater than the sum of their threshold voltages. Another disadvantage results from the fact that the current passing through the transistors $T_3$ and $T_4$ depends, in the equilibrium state of the oscillation, on the values of the threshold voltages, i.e. the control conditions also depend, in this case, to a certain extent on the threshold voltages.

Figure 2:
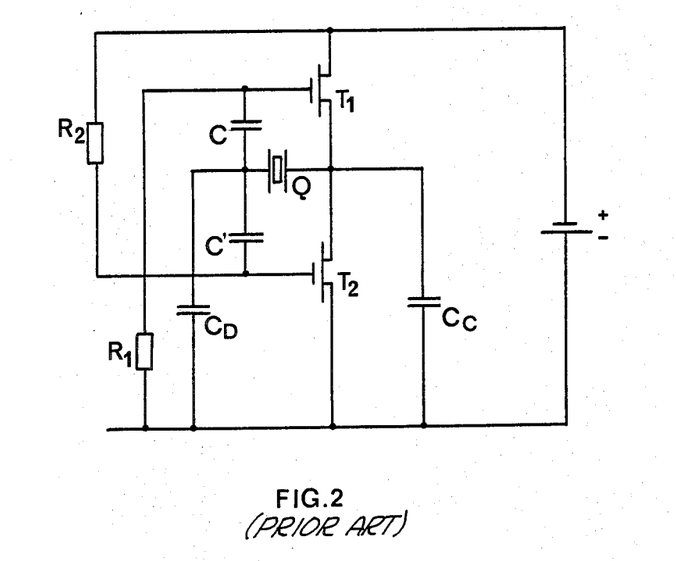

The Swiss Patent application published under No. 613,357G describes an oscillator, illustrated in FIG. 2 of the present drawings, in which two complementary transistors are biased separately for the purpose of reducing energy dissipation. In this oscillator, the gates of the P-type and N-type transistors $T_1$ and $T_2$ are connected, respectively, to the negative terminal and to the positive terminal of the supply source by means of resistors $R_1$ and $R_2$, respectively. Two coupling capacitors C and C' connect the gates of $T_1$ and $T_2$, respectively, to one terminal of a resonator Q, the other terminal of which is connected to the output of the inverter.

Such a solution makes it possible, in principle, to reduce the supply voltage to a value a little above the highest threshold voltage of the two transistors, but does not eliminate the problem of overexciting the transistors and the current consumption remains relatively high. Moreover, this oscillator contains resistors.

SUMMARY OF THE INVENTION

The purpose of the present invention is to produce an oscillator circuit which avoids overexciting the active transistors, hence is of very low power consumption, and which can be integrated, without special precautionary measures, in the same way as the digital circuits with which it is to be associated.

This purpose is achieved by providing a circuit which has an input terminal and an output terminal, between which a resonator can be connected, and which comprises a first and a second supply terminal connected respectively to the positive pole and the negative pole of a source of d.c. supply voltage, a first and a second MOS transistor, having a P channel and an N channel, respectively, the sources of which are connected, respectively, to the first and the second supply terminals and the drains of which are connected to one another and to the output terminal, an output capacitor connected between the output terminal and one of the supply terminals, and means for biasing the first and second transistors independently, such biasing means comprising, on the one hand, a third MOS transistor having a P channel, the gate and drain of which are connected to the gate of the first transistor and the source of which is connected to the drain of the latter, a first current source connected between the gate of the first transistor and the second supply terminal, and a first capacitive voltage divider connected between the input terminal and the first supply terminal and the intermediate point of which is connected to the gate of the first transistor, and, on the other hand, a fourth MOS transistor, having an N channel, the gate and drain of which are connected to the gate of the second transistor and the source of which is connected to the drain of the latter, a second current source connected between the gate of the second transistor and the first supply terminal, and a second capacitive voltage divider connected between the input terminal and the second supply terminal and the intermediate point of which is connected to the gate of the second transistor.

When it is intended to be associated with a low-frequency resonator (for example 32 kHz), the oscillator circuit according to the invention preferably contains an auxiliary circuit to insure the start of oscillation.

OBJECTS, FEATURES AND ADVANTAGES

It is therefore the object of the present invention to solve the problems encountered heretofor in the design of C-MOS oscillator circuits for use in quartz wrist watches. It is a feature of the present invention to solve these problems by providing a novel C-MOS oscillator circuit which does not use resistors. An advantage to be derived is that the present circuit is very low in power consumption. Another advantage is that overexciting of the active transistors is avoided. A still further advantage is that the present circuit may be readily integrated, without special precautionary measures, in the same way as the digital circuits with which it is to be associated. Another advantage is that the present circuit is highly insensitive to variations in the manufacturing processes.

Still other objects, features, and attendant advantages of the present invention will become apparent to those skilled in the art from a reading of the following detailed description of the preferred embodiment constructed in accordance therewith, taken in conjunction with the accompanying drawings wherein like numerals designate like parts in the several figures and wherein:

DESCRIPTION OF THE PREFERRED EMBODIMENTS

Figure 3:
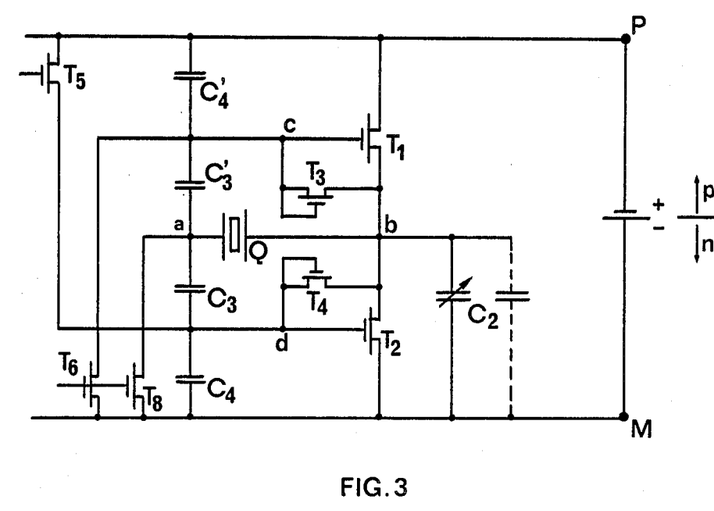
FIG. 3 is a circuit diagram of one embodiment of an oscillator circuit constructed in accordance with the teachings of the present invention.

Referring now to FIG. 3, an oscillator constructed in accordance with the teachings of the present invention, contains a P-type transistor $T_1$ and an N-type transistor $T_2$, the drains of which are connected together. The sources of transistors $T_1$ and $T_2$ are connected, respectively, to the supply terminals P and M of the circuit, between which is connected a source of d.c. supply voltage, i.e. a battery. The positive pole of the source is connected to the terminal P.

A quartz resonator Q is connected between the common point b of the drains of transistors $T_1$ and $T_2$ and a point a connected to the gates of transistors $T_1$ and $T_2$ by means of capacitors $C'_3$ and $C_3$, respectively, of essentially equal values. Two other capacitors $C'_4$ and $C_4$, of essentially the same value, connect the gates of transistors $T_1$ and $T_2$, respectively, to the terminals P and M, respectively. An output capacitor $C_2$ consists of a variable capacitor connected between point b and terminal M, in parallel with the input capacitor of the circuit connected to the oscillator, for example, a frequency-divider circuit. This input capacitor is represented by a broken line in FIG. 3.

The oscillator also contains a third P-type transistor $T_3$, the gate and drain of which are connected to the gate of transistor $T_1$ and the source of which is connected to the drain of transistor $T_1$. Likewise, the source of a fourth N-type transistor $T_4$ is connected to the drain of transistor $T_2$, and its gate and drain are connected to the gate of transistor $T_2$.

The gate of transistor $T_1$ is connected to the drain of an N-type transistor $T_6$, the source of which is connected to terminal M. Transistor $T_6$, which is controlled by a d.c. voltage close to its threshold voltage, constitutes a current source supplying a current of a very low value (a few nanoamperes). Likewise, the gate of transistor $T_2$ is connected to the source of a P-type transistor $T_5$, the drain of which is connected to terminal P, and which functions in a manner similar to transistor $T_6$.

Figure 4:
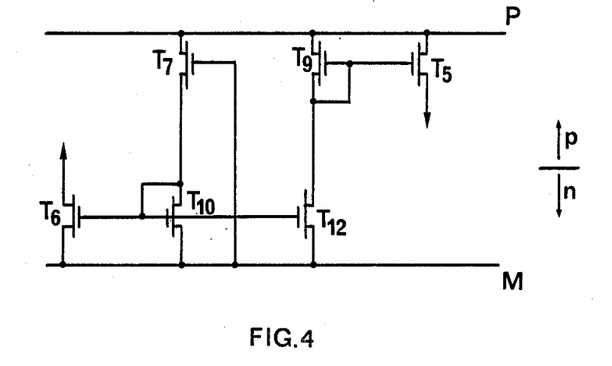
FIG. 4 is a diagram of a circuit which can be used to control the current sources of the circuit of FIG. 3.

Well-known circuits, such as that illustrated in FIG. 4, which use current mirrors, can be used to control current sources $T_5$ and $T_6$. In the circuit of FIG. 4, transistors $T_7$ and $T_9$ are of the same type as transistor $T_5$, i.e. P-type, while transistors $T_{10}$ and $T_{12}$ are of the same type as transistor $T_6$, i.e. N type. The current $I_o$ passing through transistors $T_7$ and $T_{10}$ is determined by the supply voltage and the characteristics of transistor $T_7$, particularly by the ratio between the width and the length of its channel. $T_7$ will, therefore, be made with a channel having a length much greater than its width, to obtain a very low current $I_o$.

Moreover, it is known that the drain currents of transistors of the same conduction type, which are part of one and the same integrated circuit and which operate in the saturation range, are, at first approximation, proportional to their respective dimensional ratios $W_i/L_i$, $W_i$ and $L_i$ denoting, respectively, the width and the length of the channel of the transistor. The current $I_6$ determined by transistor $T_6$ will therefore be given by $$I_6 = I_o \cdot L_{10}/W_{10} \cdot W_6/L_6.$$

Likewise, the current $I_5$ determined by the source $T_5$ will be given by $$I_5 = I_o \cdot L_{10}/W_{10} \cdot W_{12}/L_{12} \cdot L_9/W_9 \cdot W_5/L_5.$$

These currents will be of a few nanoamperes.

Finally, the oscillator circuit illustrated in FIG. 3 contains an N-type transistor $T_8$ which is connected between point a and terminal M and the gate of which is connected to the gate of transistor $T_6$. Transistor $T_8$ serves solely to fix the d.c. potential of point a. Instead of using a transistor, point a could be connected to an independent p or n zone.

It will be seen from an inspection of FIG. 3 that the oscillator circuit contains two elementary circuits, the first one including transistors $T_1$, $T_3$, and $T_6$ and capacitors $C'_3$ and $C'_4$, and the second one including transistors $T_2$, $T_4$, and $T_5$ and capacitors $C_3$ and $C_4$, the two circuits, with the exception of the type of transistors, being identical in respect of the nature and arrangement of their components, the corresponding components of the two circuits occupying a symmetrical position relative to resonator Q. Consequently, an explanation of the functioning of the oscillator circuit can be limited to one or the other of these elementary circuits, which function analogously.

When the supply voltage is cut in, oscillation starts as soon as the d.c. input voltages of transistors $T_1$ and $T_2$ have exceeded their threshold voltages sufficiently for the conditions of oscillation to be satisfied. The amplitude of oscillation is limited as follows:

It can be shown that the bias voltage $V_{do}$ of transistor $T_2$ is very close to:

$$V_{do} = V_{Dmin} - V_d + V_{T4} + (1/\beta) \ln (i_s/i_{o4})$$

where $V_{Dmin}$ is the minimum instantaneous value of the source/drain voltage of transistor $T_2$, $V_d$ is the amplitude of the control voltage of transistor $T_2$, $V_{T4}$ is the extrapolated threshold voltage of transistor $T_4$, $\beta$ is a coefficient defined as the inverse of the product of the thermodynamic voltage $U_T$ and the coefficient of emission n of the transistor, the value of this coefficient $\beta$ being approximately 20 to 30 $V^{-1}$, depending on the doping of the substrate of the transistor and on the thickness of the gate oxide layer, $i_s$ is the current determined by the current source $T_5$, and $i_{o4}$ is the value of the current of transistor $T_4$ corresponding to its extrapolated threshold voltage.

The control voltage $V'_d$ which, for a fraction of the duration of one cycle of the input signal, exceeds the extrapolated threshold voltage of transistor $T_2$, is given by $$V'_d = V_d + V_{do} - V_{T2}.$$

Since the extrapolated threshold voltages of transistors $T_4$ and $T_2$ are the same, by replacing $V_{do}$ by its value, the following is obtained for this control voltage:

$$V'_d = V_{Dmin} + (1/\beta) \ln (i_s/i_{o4}).$$

Transistor $T_4$ and current source transistor $T_5$, with its control, can easily be rated so that $i_{o4}$ is essentially equal to $i_s$. The term $(1/\beta) \ln (i_s/i_{o4})$ then becomes virtually zero.

The fact that the control voltage, which exceeds the threshold voltage of transistor $T_2$, is, irrespective of the value of this threshold voltage, equal to the minimum voltage of the drain of this transistor, is very important, because it is precisely for this reason any overexciting is avoided. Virtually ideal control conditions are automatically established. In fact, the determining transconductance for the amplifiers formed by transistors $T_1$ and $T_2$, together with their charges, decreases greatly with the reduction of $V_{Dmin}$, that is, with the increase in the output voltage, and the latter is therefore limited without any overexciting of the transistors.

To prevent any undesirable effect of the n-p junctions associated with transistors $T_4$ and $T_5$, the capacitive divider $C_3/C_4$ must be rated so that $$V_d \leq \tfrac{1}{2}(V_T + V_{Dmin})$$

where $V_T$ is the value of the lowest threshold voltage which can be expected in production.

Figure 5:
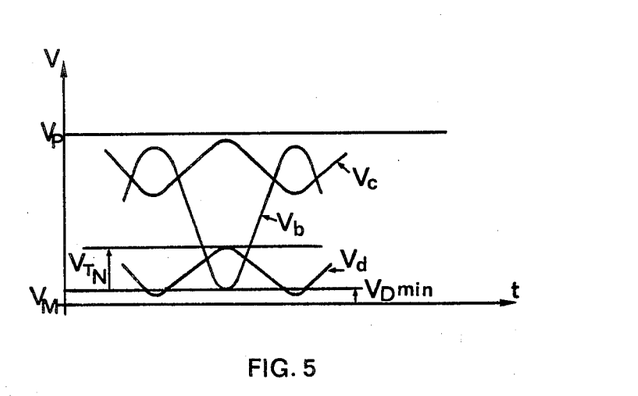
FIG. 5 is a graph useful in explaining the operation of the circuit of FIG. 3.

FIG. 5 shows the voltages $V_b$, $V_c$, and $V_d$ at the points b, c, and d, respectively, of the circuit of FIG. 3, as a function of time. $V_{TN}$ denotes the threshold voltages of the N-type transistors.

Using suitably dimensioned components, it is possible to achieve with the oscillator of the present invention just described, an output voltage, the peak-to-peak value of which reaches approximately 90% of the d.c. supply voltage. Since the transistors are practically no longer overexcited, the current consumption remains very low, despite the relatively large amplitude of the output signal. If the efficiency $\eta$ of the oscillator is defined as the ratio between the power $P_q$ dissipated in quartz crystal Q and the supply power $P_e$ of transistors $T_1$ and $T_2$ constituting the actual maintenance circuit of the oscillator, it can be shown that this efficiency is equal to approximately $$\eta = P_q/P_e \approx 2V_b/V_p \approx 0.9$$

For example, with the following data:
supply voltage: $V_p = 1.2$ V
quartz crystal: oscillation frequency = 32768 Hz
static capacitance: 1 pf
output capacitor $C_2$: 10 pf
input capacitor $C_1 = 2(C_3 C_4)/(C_3 + C_4)$: 10 pf
amplitude of the output voltage: $V_b = 0.55$ V, the power dissipated in the quartz crystal is 20 nW, which gives, for the abovementioned efficiency value, a supply current of approximately 20 nA. Added to this current are those of the current sources which can be 1 to 2 nA and the current $I_o$ (FIG. 4) for controlling these sources. With a current $I_o$ of approximately 10 nA, a consumption of the order of a few tens of nanoamperes only can easily be obtained.

Since transistors $T_1$ and $T_2$ are biased separately, the supply voltage only needs to be greater than the value of the highest threshold voltage of the transistors. This permits a very wide tolerance for the values of the threshold voltages, which can range from 0.3 to 1 V for a supply voltage of approximately 1.2 V. Because of this and because it does not contain any resistor, the present oscillator is, to a large extent, insensitive to the variations in the manufacturing parameters and can be integrated, without special precautionary measures, by means of the very same processes as those currently employed to produce the C-MOS digital circuits of an electronic watch.

The oscillator which has just been described can be used both for high-frequency resonators (several MHz) and for low-frequency resonators, for example 32 kHz. However, in the case of a low-frequency resonator, it may happen that, under certain conditions, the oscillation is not started, this being for the following reasons:

When the source of supply voltage is connected, the d.c. voltages applied to the gates of transistors $T_1$ and $T_2$ can rapidly assume relatively high values in relation to their threshold voltages. A moderately high current then passes through these transistors, each of which constitutes, together with the charge of the quartz crystal which is transformed at its output, a biased amplifier of class A. Because of the low differential dynamic resistances which are then offered by transistors $T_3$ and $T_4$, the phase conditions necessary for starting oscillation can no longer be satisfied.

Figure 6:
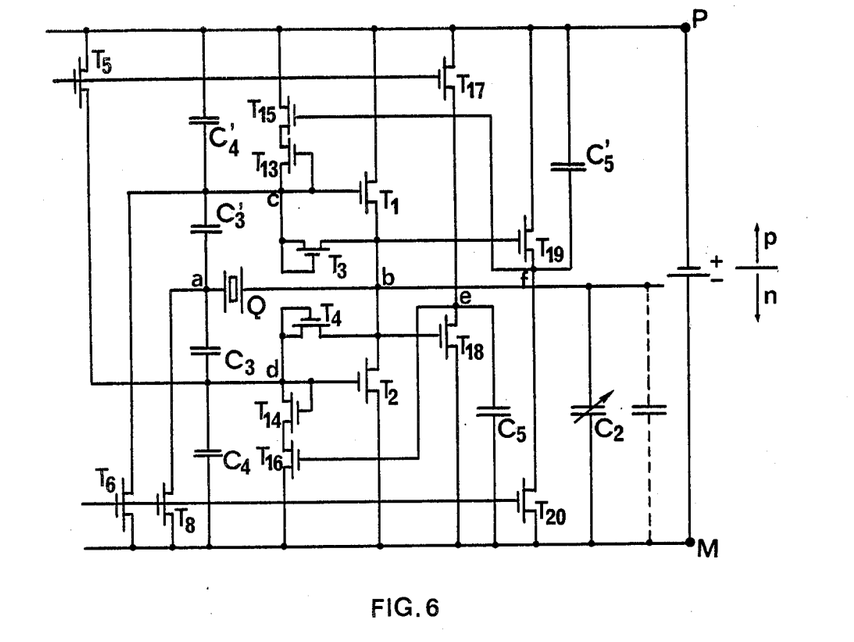
FIG. 6 is a circuit diagram of the oscillator circuit of FIG. 3, provided with a first embodiment of auxiliary circuit to insure the start of oscillation.

This phenomenon, which can occur, in particular, when capacitors of low value are used in order to limit power consumption, can be avoided by providing the oscillator with an auxiliary circuit, such as that illustrated in FIG. 6. This figure represents the actual oscillator of FIG. 3, the various components of which are designated by the same reference symbols. Moreover, it can be seen that the auxiliary circuit for triggering oscillation has the same symmetry in respect of the line joining points a and b as the oscillator circuit itself. The four transistors located above this line are of the P type, while the four corresponding transistors shown below the line are of the N type.

The starting circuit comprises two transistors $T_{18}$ and $T_{19}$, the gates of which are connected to connection point b and the sources of which are connected, respectively, to terminals M and P. This circuit also comprises two current sources $T_{17}$ and $T_{20}$ which are connected respectively between the drain of transistor $T_{18}$ and terminal P and between the drain of transistor $T_{19}$ and terminal M. The gates of current sources $T_{17}$ and $T_{20}$ are connected, respectively, to those of sources $T_5$ and $T_6$. Each of transistors $T_{18}$ and $T_{19}$ forms, with its associated current source, a voltage amplifier. Two capacitors $C_5$ and $C'_5$ are connected respectively between the drain and the source of transistor $T_{18}$ and between the drain and the source of transistor $T_{19}$.

The starting circuit also comprises a transistor $T_{13}$, connected as a diode, the drain of which is connected to the gate of transistor $T_1$, and a transistor $T_{15}$ connected between the source of transistor $T_{13}$ and terminal P. The control electrode of transistor $T_{15}$ is connected to the drain of transistor $T_{19}$. Likewise, a transistor $T_{14}$, connected as a diode, and a transistor $T_{16}$, the gate of which is connected to the drain of $T_{18}$, are connected between the gate of transistor $T_2$ and terminal M.

When the source of supply voltage is connected, all the transistors work in low-inversion operation. Transistors $T_{18}$ and $T_{19}$ are, first of all, virtually blocked; the point of connection e is brought to the potential of the positive pole of the source of supply voltage, and the point of connection f is brought to the potential of the negative pole of the source of supply voltage. Consequently, transistors $T_{15}$ and $T_{16}$ are conductive. Because of transistors $T_{13}$ and $T_{14}$, the d.c. control voltages of transistors $T_1$ and $T_2$ remain close to their threshold voltages. Transistors $T_{13}$ and $T_{14}$ form with $T_1$ and $T_2$, respectively, current mirrors. Transistors $T_1$ and $T_{13}$ can be rated so that the current passing through $T_1$ is, for example, a hundred times higher than that passing through transistor $T_{13}$, the same applying to transistors $T_2$ and $T_{14}$.

Let us assume, for example, that only transistor $T_2$ is in the saturation range. The potential of point b increases with respect to that of point M. As soon as the output voltage reaches a value close to the threshold voltage of the N-type transistors, transistor $T_{18}$ becomes conductive, and the positive potential of point e drops, the effect of which is to block transistor $T_{16}$. The increase in the potential of point d relative to that of point M, which follows, has a reverse effect; an equilibrium is rapidly established, in which the output voltage remains close to the threshold voltage of the N-type transistors, and transistors $T_1$ and $T_2$ are in the saturation range. An analogous process would take place with transistors $T_{13}$, $T_{15}$, $T_{19}$ and $T_{20}$, if, when the source of supply voltage is connected, only transistor $T_1$ were in the saturation range. The output voltage of the oscillator would then reach the threshold voltage of the P-type transistors. In this state, transistors $T_3$ and $T_4$ are blocked, and it is easy to dimension the various components of the circuit to insure that the necessary conditions of oscillation are then satisfied.

When oscillation has been started and an equilibrium state has been established, transistors $T_{18}$ and $T_{19}$ are made conductive alternately and periodically. If the current sources $T_{17}$ and $T_{20}$, with their biasing transistors $T_7$, $T_9$, $T_{10}$, and $T_{12}$ (see FIG. 4), are dimensioned to determine currents of a few nanoamperes, it is sufficient, for an oscillation frequency of 32 kHz, that the values of capacitors $C_5$ and $C'_5$ are a few picofarads, to keep the voltage fluctuations at points e and f lower than 0.1 volt. The mean voltage between points e and M is, then, virtually equal to zero and that between points f and M is virtually equal to the supply voltage $V_p$. Transistors $T_{15}$ and $T_{16}$ remain blocked, and the functioning of the actual oscillator is then identical to that described above in relation to FIG. 3.

Although it is most often appropriate to operate the oscillator so as to obtain the lowest possible amplitude of oscillation which is compatible with the control of the circuit to which it is connected, it may sometimes be necessary to have an output signal of large amplitude and to have the oscillator supplied by a relatively high voltage, greater than the sum of the threshold voltages of the two types of transistors of the circuit. In this case, it may happen that the auxiliary circuit described in connection with FIG. 6 does not always, in its symmetrical version, enable oscillation to start.

It is possible to avoid this disadvantage by insuring that always the same one of the transistors $T_1$ and $T_2$ determines the starting current. This can be effected, for example, for transistor $T_1$, by connecting the source of transistor $T_{13}$ directly to terminal P, transistors $T_{15}$, $T_{19}$, and $T_{20}$ and capacitor $C'_5$ being omitted, and by dimensioning transistor $T_{13}$ so that it has a very long and narrow channel compared with that of transistor $T_{14}$.

Figure 7:
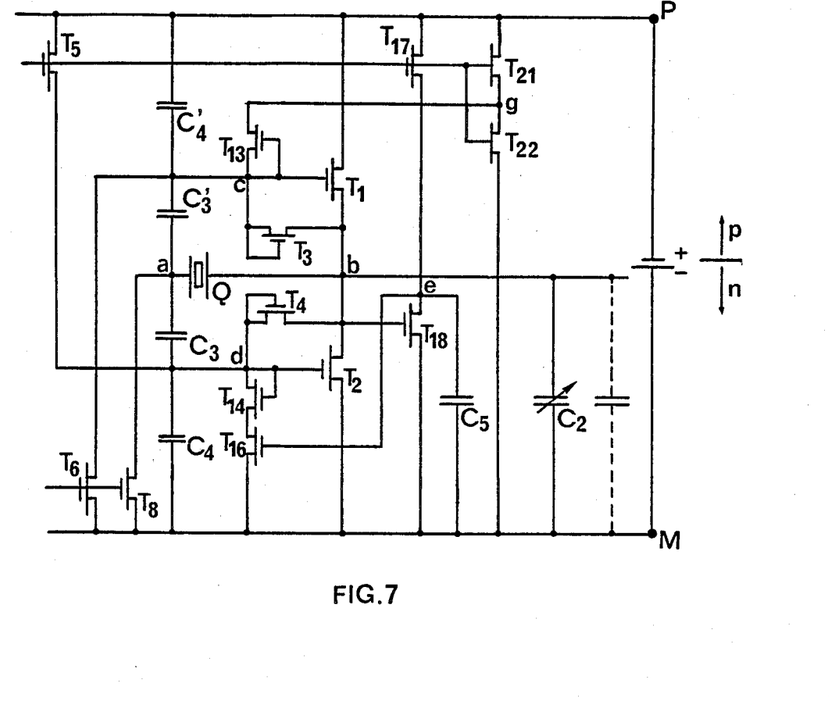
FIG. 7 is a circuit diagram of the oscillator circuit of FIG. 3, provided with a second embodiment of auxiliary circuit to insure the start of oscillation.

Another solution, used in the embodiment of the starting circuit illustrated in FIG. 7, is to bring the source of transistor $T_{13}$, at the moment of starting, to a specified potential lower than that of the positive pole on the source of supply voltage, so as to adjust the bias voltage of transistor $T_1$, and, consequently, the starting current of the oscillator, to the desired value. The circuit of FIG. 7, in which the same components as those of the circuit of FIG. 6 are denoted by the same reference symbols, differs from the latter in that transistor $T_{15}$, the amplifier $T_{19}$, $T_{20}$ associated with it, as well as capacitor $C'_5$, have been omitted, and in that the source of transistor $T_{13}$ is now connected to connection point g between the drain of a P-type transistor $T_{21}$ and the source of another P-type transistor $T_{22}$, these two transistors $T_{21}$ and $T_{22}$ being connected in series between terminals P and M and their gates both being connected to that of current source $T_5$. Transistor $T_{21}$, which is the current source, and transistor $T_{22}$ form a voltage source.

On condition that a current $i_6$ determined by transistor $T_6$, which is below the current $i_{21}$ passing through transistor $T_{21}$, is provided, a potential $V_g$ appears at point g at the time of starting the oscillation, this potential being below that of terminal P of the circuit and being, to a large extent, independent of current $i_{21}$. It can be shown that this potential $V_g$ is essentially equal to $$-\frac{1}{\beta(1+x)}\left(\ln \frac{W_{22}}{L_{22}} \cdot \frac{L_{21}}{W_{21}} - \ln \frac{i_{22}}{i_{22}+i_6}\right)$$

in which expression $W_{21}/L_{21}$ and $W_{22}/L_{22}$ are the respective dimensional ratios of transistors $T_{21}$ and $T_{22}$, $i_{22}$ is the current in transistor $T_{22}$, $\beta$ is the inverse of the product of the thermodynamic voltage and the coefficient of emission and x is a parameter, the value of which is determined by the "body effect" which is involved in transistor $T_{22}$, the "body effect" denoting the phenomenon by which the threshold voltage of a transistor is modified when the latter's source is brought to a potential different from that of the substrate.

In fact the term $\ln (i_{22}/i_{22}+i_6)$ is small in comparison with the quantity $\ln W_{22}/L_{22} \cdot L_{21}/W_{24}$. The potential $V_g$, and, consequently, the starting current in transistor $T_1$ are, therefore, determined essentially by the configuration of transistors $T_{21}$ and $T_{22}$. The condition $i_6$ being below $i_{21}$ is easy to satisfy by dimensioning transistor $T_{21}$ correctly in relation to transistors $T_5$ and $T_6$.

In the normal functioning state of the oscillator, transistor $T_{13}$, the source of which is then brought to a potential slightly below that applied to it at the moment of starting, the current $i_6$ then passing through transistor $T_3$, continues to have a current passing through it, but this current, which is very low, has virtually no influence.

It should be noted that, instead of transistors $T_{15}$, $T_{19}$, and $T_{20}$ and capacitor $C'_5$, transistors $T_{16}$, $T_{17}$, and $T_{18}$ and capacitor $C_5$ could have been omitted, and the source of transistor $T_{14}$ could have been brought to a definite potential above that of terminal M by means of a voltage source created analogously to that of transistors $T_{21}$ and $T_{22}$, illustrated in FIG. 7, using N-type transistors.

The invention is, of course, not limited to the exemplary embodiments which have just been described. For example, in the case of relatively high frequencies, the gate/substrate capacitances of transistors $T_1$ and $T_2$ can be used as capacitors $C'_4$ and $C_4$ and, in the case of low frequencies, it is possible to provide an input capacitor connected between points a and M of the circuit, to reduce the space occupied by the capacitors in the integrated circuit. It is not necessary for the resonator to be of the quartz type. This circuit makes it possible to use other types of resonators, whether piezoelectric or not, for example an L-C circuit. Furthermore, embodiments other than those described can be envisaged for the auxiliary circuit for starting oscillation.

I claim:

1. In a C-MOS oscillator circuit of the type having input and output terminals, between which a resonator can be connected, first and second supply terminals adapted to be connected to the positive and negative poles, respectively, of a source of d.c. supply voltage, a first P-type MOS transistor and a second N-type MOS transistor, the sources of said transistors being connected to the first and second supply terminals, respectively, and the drains of said transistors being connected to one another and to said output terminal, an output capacitor connected between said output terminal and one of said supply terminals, and means for independently biasing said first and second transistors, the improvement wherein said biasing means comprises:
    a third P-type MOS transistor, the gate and drain thereof being connected to the gate of said first transistor and the source thereof having connected to the drain of said first transistor;
    a first current source connected between the gate of said first transistor and said second supply terminal;
    a first capacitive divider connected between said input terminal and said first supply terminal, the intermediate point of said divider being connected to the gate of said first transistor;
    a fourth N-type MOS transistor, the gate and drain thereof being connected to the gate of said second transistor and the source thereof being connected to the drain of said second transistor;
    a second current source connected between the gate of said second transistor and said first supply terminal; and
    a second capacitive voltage divider connected between said input terminal and said second supply terminal, the intermediate point of said divider being connected to the gate of said second transistor.

2. In an oscillator circuit according to claim 1, the improvement further comprising:
    an auxiliary circuit for starting oscillation.

3. In an oscillator circuit according to claim 2, the improvement wherein said auxiliary circuit comprises:
    fifth and sixth P-type MOS transistors connected in series between the gate of said first transistor and said first supply terminal, the gate of said fifth transistor being connected to its drain;

seventh and eighth N-type MOS transistors connected in series between the gate of said second transistor and said second supply terminal, the gate of said seventh transistor being connected to its drain; and control means coupled to said output terminal for controlling said sixth and eighth transistors so as to make them conductive in the absence of oscillation and to block them when the equilibrium state of oscillation has been established.

4. In an oscillator circuit according to claim 3, the improvement wherein said control means comprises:

means for controlling said sixth transistor comprising:
a ninth P-type MOS transistor, the source, gate and drain of which being connected to said first supply terminal, said output terminal, and the gate of said sixth transistor, respectively;
a third current source connected between the drain of said ninth transistor and said second supply terminal; and
a capacitor connected between the source and the drain of said ninth transistor; and means for controlling said eighth transistor comprising:
a tenth N-type MOS transistor, the source, gate and drain of which being connected to said second supply terminal, said output terminal and the gate of said eighth transistor, respectively;
a fourth current source connected between said first supply terminal and the drain of said tenth transistor; and
a capacitor connected between the source and the drain of said tenth transistor.

5. In an oscillator circuit according to claim 2, the improvement wherein said auxiliary circuit comprises:
a fifth P-type MOS transistor, the gate and drain of which being connected to the gate of said first transistor;
a voltage source for bringing the source of said fifth transistor to a specified potential below the potential of said first supply terminal, at least until an equilibrium state of oscillation has been established;
sixth and seventh N-type MOS transistors connected in series between the gate of said second transistor and said second supply terminal, the gate of said sixth transistor being connected to its drain; and
control means coupled to said output terminal for controlling said seventh transistor so as to make it conductive in the absence of oscillation and to block it when the equilibrium state of oscillation has been established.

6. In an oscillator circuit according to claim 5, the improvement wherein said control means comprises:
an eighth N-type MOS transistor, the source, gate and drain thereof being connected to said second supply terminal, said output terminal and the gate of said seventh transistor, respectively;
a third current source connected between said first supply terminal and the drain of said eighth transistor; and
a capacitor connected between the source and the drain of said eighth transistor.

7. In an oscillator circuit according to claim 5 or 6, the improvement wherein said voltage source comprises:
a ninth P-type MOS transistor controlled so as to constitute a current source, the source thereof being connected to said first supply terminal; and
a tenth P-type MOS transistor, the source, drain and gate thereof being connected to the drain of said ninth transistor, said second supply terminal, and the gate of said ninth transistor, respectively, the source of said fifth transistor being connected to the point of connection of the drain of said ninth transistor and the source of said tenth transistor.

8. In an oscillator circuit according to claim 2, the improvement wherein said auxiliary circuit comprises:
fifth and sixth P-type MOS transistors connected in series between the gate of said first transistor and said first supply terminal, the gate of said fifth transistor being connected to its drain;
control means coupled to said output terminal for controlling said sixth transistor so as to make it conductive in the absence of oscillation and to block it when an equilibrium state of oscillation has been established;
a seventh N-type MOS transistor, the gate and drain thereof being connected to the gate of said second transistor; and
a voltage source for bringing the source of said seventh transistor to a specified potential above the potential of said second supply terminal, at least until the equilibrium state of oscillation has been established.

9. In an oscillator circuit according to claim 8, the improvement wherein said control means comprises:
an eighth P-type MOS transistor, the source, gate and drain thereof being connected to said first supply terminal, said output terminal, and the gate of said sixth transistor, respectively;
a third current source connected between the drain of said eighth transistor and said second supply terminal; and
a capacitor connected between the source and the drain of said eighth transistor.

10. In an oscillator circuit according to claim 8 or 9, the improvement wherein said voltage source comprises:
a ninth N-type MOS transistor controlled so as to constitute a current source, the source thereof being connected to said second supply terminal; and
a tenth N-type MOS transistor, the source, drain and gate thereof being connected to the drain of said ninth transistor, said first supply terminal and the gate of said ninth transistor, respectively, the source of said seventh transistor being connected to the point of connection of the drain of said ninth transistor and the source of said tenth transistor.

* * * * *